United States Patent
Ogawa et al.

(10) Patent No.: US 9,082,469 B2
(45) Date of Patent: Jul. 14, 2015

(54) SEMICONDUCTOR MEMORY DEVICE AND WRITING METHOD OF ID CODES AND UPPER ADDRESSES

(75) Inventors: Akira Ogawa, Tokyo (JP); Yoshichika Nakaya, Tokyo (JP)

(73) Assignee: Powerchip Technology Corp., Hsin-chu (TW)

( * ) Notice: Subject to any disclaimer, the term of this patent is extended or adjusted under 35 U.S.C. 154(b) by 343 days.

(21) Appl. No.: 13/619,273

(22) Filed: Sep. 14, 2012

(65) Prior Publication Data

US 2013/0279253 A1    Oct. 24, 2013

(30) Foreign Application Priority Data

Apr. 18, 2012    (JP) .................................. 2012-094792

(51) Int. Cl.
*G11C 17/16*    (2006.01)
*G11C 8/12*    (2006.01)
*G11C 7/16*    (2006.01)
*G11C 7/20*    (2006.01)
*G11C 29/44*    (2006.01)

(52) U.S. Cl.
CPC .. *G11C 8/12* (2013.01); *G11C 7/16* (2013.01); *G11C 7/20* (2013.01); *G11C 2029/4402* (2013.01); *H01L 2224/48091* (2013.01); *H01L 2224/48227* (2013.01); *H01L 2924/15311* (2013.01); *H01L 2924/3011* (2013.01)

(58) Field of Classification Search
CPC .............. G11C 7/16; G11C 7/20; G11C 8/12; G11C 2029/4402; H01L 2924/3011; H01L 2924/15311; H01L 2224/48091; H01L 2224/4822

USPC ............................ 365/96, 225.7, 201, 230.03
See application file for complete search history.

(56) References Cited

U.S. PATENT DOCUMENTS

| | | | |
|---|---|---|---|
| 5,642,307 A * | 6/1997 | Jernigan | ....................... 365/103 |
| 7,483,317 B2 | 1/2009 | Ikeda et al. | |
| 7,795,706 B2 | 9/2010 | Ikeda | |
| 2005/0082664 A1 * | 4/2005 | Funaba et al. | ................ 257/724 |

FOREIGN PATENT DOCUMENTS

| | | |
|---|---|---|
| JP | H05-074135 A | 3/1993 |
| JP | 2000-228341 A | 8/2000 |
| JP | 2007-265548 A | 10/2007 |
| JP | 2008077779 | 4/2008 |
| JP | 2009-27073 A | 2/2009 |

* cited by examiner

*Primary Examiner* — Thao H Bui

(74) *Attorney, Agent, or Firm* — Muncy, Geissler, Olds & Lowe, P.C.

(57) ABSTRACT

A semiconductor chip D1 of a flash memory which is stacked together with other semiconductor chips D2~DN to form a multi-chip package (MCP), including a memory cell array 20 of the flash memory for storing an ID code and an upper address, wherein the ID code is written into the a fuse data region 20F of the memory cell array 20 before the assembly process. According to the invention, ID codes and upper addresses can be assigned and written to each of the semiconductor chips of a multi-chip package easily without increasing the size of the semiconductor chips in comparison with the prior art.

22 Claims, 8 Drawing Sheets

SEMICONDUCTOR MEMORY DEVICE AND WRITING METHOD OF ID CODES AND UPPER ADDRESSES

CROSS REFERENCE TO RELATED APPLICATIONS

This Application claims priority of Japanese Patent Application No. 2012-094792, filed on Apr. 18, 2012, the entirety of which is incorporated by reference herein.

BACKGROUND OF THE INVENTION

1. Field of the Invention

The present invention relates to a semiconductor memory device, such as a flash memory or a DRAM, and a writing method of ID codes and upper addresses thereof, and in particular relates to a writing method of upper addresses in the case where a plurality of semiconductor elements are incorporated in a multi-chip package.

2. Description of the Related Art

For example, for a multi-chip package of a flash memory, each semiconductor chip needs to be assigned a different upper address. In order to arrange common wires for control pins and input/output pins of the semiconductor chips in the multi-chip package, the corresponding pins are all connected together. In this case, if each semiconductor chip isn't assigned an upper address, one-on-one selection for address input cannot be performed. Here, an upper address means the most significant address of an address range which is assigned differently from each semiconductor chip in a multi-chip package.

FIG. 1 is a sectional view showing the wire arrangement of semiconductor chips D1~DN of a multi-chip package 10 in accordance with the conventional art. As shown in FIG. 1, a pin with the same name of each semiconductor chip is connected to a corresponding pin in the multi-chip package. Usually, to distinguish one semiconductor chip from the others, a chip enable (/CE) signal pin of each semiconductor chip (for example, /CE1,/ CE2, . . . /CEN) is bonded to a chip enable (CE) signal pin that is different from the other chip enable signal pins in the multi-chip package 10. However, in this case, (N-1) individual package pins are necessary in additionally. Note that in this specification, for a low active signal, "/" is added in front of the reference symbol of each signal instead of adding an over bar.

Furthermore, Patent document 1 discloses a semiconductor memory device having a plurality of semiconductor chips, wherein control signals are input from input/output pads and control pads connected together in order to separately activate a memory chip within a plurality of memory chips layered and connected together by a via hole. The semiconductor chip comprises a self-address memory portion storing a self chip address, a determination portion comparing a selection address input from the outside through the input/output pad with the self chip address and determining if there is consistency between them, and a control signal setting portion setting the control signal input to the self semiconductor chip into "active" or "inactive" according to the result of a consistency determination. However, the method still has big problems, including chip management, as will be described later.

Patent document 1: Japan Patent Application Publication No. 2008-077779

FIG. 2 is a circuit diagram showing a writing method for writing an ID code and an upper address to each of the semiconductor chips D1~DN of the multi-chip package shown in FIG. 1. As shown in FIG. 2, the upper address is assigned by wire bonding a plurality of bonding pads of each semiconductor chip to a high-level voltage VCC lead frame or a low-level voltage VSS lead frame in, for example, the assembly process. After the upper address is assigned, each semiconductor chip can be selected appropriately by inputting an appropriate address. Here, the bonding pads occupy a huge area on the semiconductor chip, resulting in an increase of the semiconductor chip size.

In Patent document 1, the circuit is formed such that an upper address is written in each semiconductor chip before the assembly process and the address is compared with an input address. Therefore, special pads or bonding wires are not necessary. However, in the assembly process, more complicated control and chip management are required. In this regard, Patent document 1 cannot provide a flexible manufacturing method. When writing the upper address, it should be managed by chip location which address is assigned to which chip from the wafer test, and the respective chip written with the address should be picked up correctly for assembly. Such management is very difficult. Further, to write an address to a chip or to read the written address from the chip before the chip is picked up in the assembly process, each pad should be probed and provided with power or a signal. Therefore, the assembly process becomes more difficult than a pure assembly process, and manufacturing cost increases.

In order to solve the above problems, the purpose of the invention is to provide a semiconductor memory device and a writing method of ID codes and upper addresses thereof, capable of assigning and writing the ID codes and the upper addresses to each semiconductor chip in a multi-chip package, and not increasing the sizes of the semiconductor chips in comparison with the prior art.

BRIEF SUMMARY OF THE INVENTION

A detailed description is given in the following embodiments with reference to the accompanying drawings.

The first invention provides a semiconductor memory device which is stacked together with other semiconductor memory devices to form a multi-chip package, the semiconductor memory device comprising: a non-volatile memory means storing an ID code and an upper address, wherein the ID code is written into the non-volatile memory means before the assembly process.

In the semiconductor memory device, the semiconductor memory device is a flash memory, and the non-volatile memory means is a memory type fuse element in a memory cell array of the flash memory.

In the semiconductor memory device, the semiconductor memory device is a volatile memory device, and the semiconductor memory device is further provided with a non-volatile memory means for storing the ID code and the upper address in addition to the volatile memory device.

The semiconductor memory device further comprises a first comparing means responding to an ID code match command which is input from an external device to the semiconductor memory device and indicates a predetermined ID code search, searching for the ID code of the semiconductor memory device, comparing the predetermined ID code and the searched ID code, and outputting a comparison result.

The semiconductor memory device further comprises a second comparing means responding to an input signal which is toggled and an ID code search command which is input from an external device to the semiconductor memory device and indicates a predetermined ID code search, counting the pulse number of the input signal toggled, searching for the ID code of the semiconductor memory device when the count value is equal to the value of the ID code of the semiconductor memory device, comparing the predetermined ID code and the searched ID code, and outputting a comparison result.

In the semiconductor memory device, when the first comparing means outputs the comparison result showing the ID codes are consistent with each other, the semiconductor memory device has an active status and is allowed to receive other commands from the external device until the semiconductor memory device receives an ID release command input from the external device and indicating access from the external device is finished. On the other hand, when the first comparing means outputs the comparison result showing the ID codes are not consistent with each other, the semiconductor memory device goes into standby status to wait for the ID code match command or the ID release command.

The semiconductor memory device further comprises a signal output means for outputting a signal showing that the semiconductor memory device is ready when the first or second comparing means outputs the comparison result showing the ID codes are consistent with each other.

In the semiconductor memory device, the ID code match command is input to the semiconductor memory device after a plurality of the semiconductor memory devices are stacked to form the multi-chip package.

In the semiconductor memory device, the ID code search command is input to the semiconductor memory device after a plurality of the semiconductor memory devices are stacked to form the multi-chip package.

In the semiconductor memory device, the predetermined ID code indicated by the ID match command is stored in a memory means of the external device.

In the semiconductor memory device, the predetermined ID code indicated by the ID search command is stored in a memory means of the external device.

In the semiconductor memory device, the ID code is written into the non-volatile memory means of the semiconductor memory device in the wafer test operation.

The semiconductor memory device further comprises a first register means for reading and storing the ID code read from the non-volatile memory means when the semiconductor memory device is powered on.

In the semiconductor memory device, the upper address is written into the non-volatile memory means when a plurality of the semiconductor memory devices are stacked to form the multi-chip package and the semiconductor memory device is in active status.

The semiconductor memory device further comprises a second register means for reading and storing the upper address read from the non-volatile memory means when the semiconductor memory device is powered on.

The second invention provides a writing method for writing an ID code and an upper address to a semiconductor memory device, which is stacked together with other semiconductor memory devices to form a multi-chip package, wherein the semiconductor memory device comprises a non-volatile memory means storing an ID code and an upper address, and wherein the writing method comprises writing the ID code into the non-volatile memory means before the assembly operation.

In the writing method, the ID code is written into the non-volatile memory means in the wafer test operation.

The writing method further comprises writing the upper address into the non-volatile memory means when a plurality of the semiconductor memory devices are stacked to form the multi-chip package and the semiconductor memory device is under an active status.

According to the semiconductor memory device and the writing method of ID codes and upper addresses thereof of the invention, the ID codes and the upper addresses can be assigned and easily written to each of the semiconductor chips in a multi-chip package without increasing the size of the semiconductor chips in comparison with the prior art.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 3:
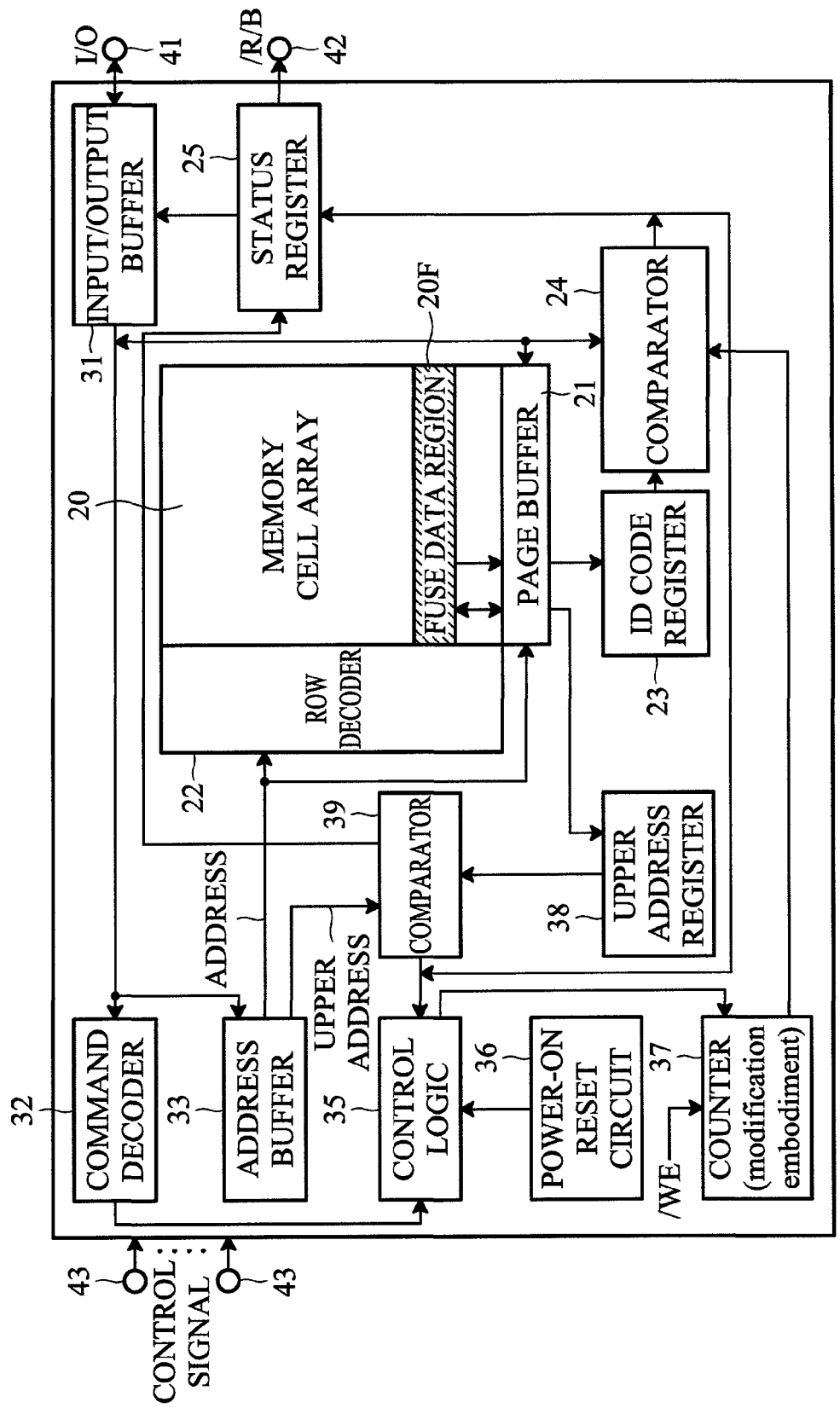
FIG. 3 is a block diagram showing a circuit structure of a semiconductor chip of a flash memory in accordance with an embodiment of the invention.

FIG. 3 is a block diagram showing a circuit structure of a semiconductor chip of a flash memory in accordance with an embodiment of the invention. The semiconductor chip of the flash memory of the embodiment is one of the semiconductor chips D1~DN for forming a multi-chip package (MCP) by stacking the semiconductor chips D1~DN. The semiconductor chip is provided with a memory cell array 20 of the flash memory for storing an ID code and an upper address. The ID code is written to a fuse (a memory type fuse element) of a fuse data region 20F of the memory cell array 20 before the assembly process.

In FIG. 3, each of the semiconductor chips D1~DN of the flash memory includes:
(1) a memory cell array 20 for storing data, the memory cell array 20 having a fuse data region 20F for storing each ID code and upper address;
(2) a page buffer 21 used when data is written to or read from the memory cell array 20 by a page unit;
(3) a row decoder 22 for specifying a row of the memory cell array 20 in response to a specified address;

(4) an ID code register 23 for temporarily storing the ID code read from the memory cell array 20 via the page buffer 21;
(5) a comparator 24 for comparing an ID code input from an input/output buffer (the embodiment) or an ID code counted by a counter 37 (the modification embodiment) with the ID code stored in the ID code register 23, and outputting a comparison result;
(6) a status register 25 for temporarily storing and then outputting the status of the semiconductor chip to an input/output buffer 31, and generating and then outputting a ready/busy signal (R/B signal) to an R/B signal terminal 42, according to the comparison result from the comparator 24 or a comparator 39;
(7) an input/output buffer 31 for temporarily storing the data input or output via an input/output terminal 41;
(8) a command decoder 32 for encoding a command from the input/output buffer 31 and outputting the decoded command data to a control logic 35;
(9) an address buffer 33 for temporarily storing the specified address from the input/output buffer 31 or the upper address;
(10) a power-on reset circuit 36 for outputting a reset signal to reset the operation of the semiconductor chip when power is on;
(11) a control logic 35 for performing predetermined controls to each circuit in the semiconductor chip according to the command data from the command decoder 32, the control signal input via the control signal terminal 43, the comparison result from the comparator 39, or the reset signal from the power-on reset circuit 36. In the embodiment, the control logic 35 responds to a reset signal and controls the ID code register 23 to read the ID code from the fuse of the fuse data region 20F via the page buffer 21, and in the modification embodiment, the control logic 35 responds to a reset signal and resets a counter 37;
(12) a counter 37 for responding to an ID code search command or an ID code match command and outputting a counter value counting write-enable signals /WE to the comparator 24, wherein the detail of the counter 37 is described later in the modification embodiment of FIG. 7;
(13) an upper address register 38 for temporarily storing the upper address read from the memory cell array 20 via the page buffer 21; and
(14) a comparator 39 for comparing the upper address from the address buffer 33 with the upper address from the upper address buffer 38, and outputting a comparison result to the control logic 35.

Particularly, the semiconductor chip of the embodiment has the fuse data region 20F in the memory cell array 20. The semiconductor chip of the embodiment further has the power-on reset circuit 36, the ID code register 23, the comparator 24, the status register 25, the upper address register 38, and the comparator 39. In addition, the semiconductor chip of the modification embodiment of FIG. 7 described later further has the counter 37.

After the upper address is written to the fuse data region 20F, the upper address register 38 and the comparator 39 is used when the semiconductor chip is powered on and the memory cell array 20 is in the reading or writing state (active state). Namely, when the semiconductor chip is powered on, the upper address is read from the fuse data region 20F of the memory cell array 20 via the page buffer 21 and stored in the upper address register 38, and then compared with an address indicated (input) from an external device such as a tester by the comparator 39.

Figure 4:
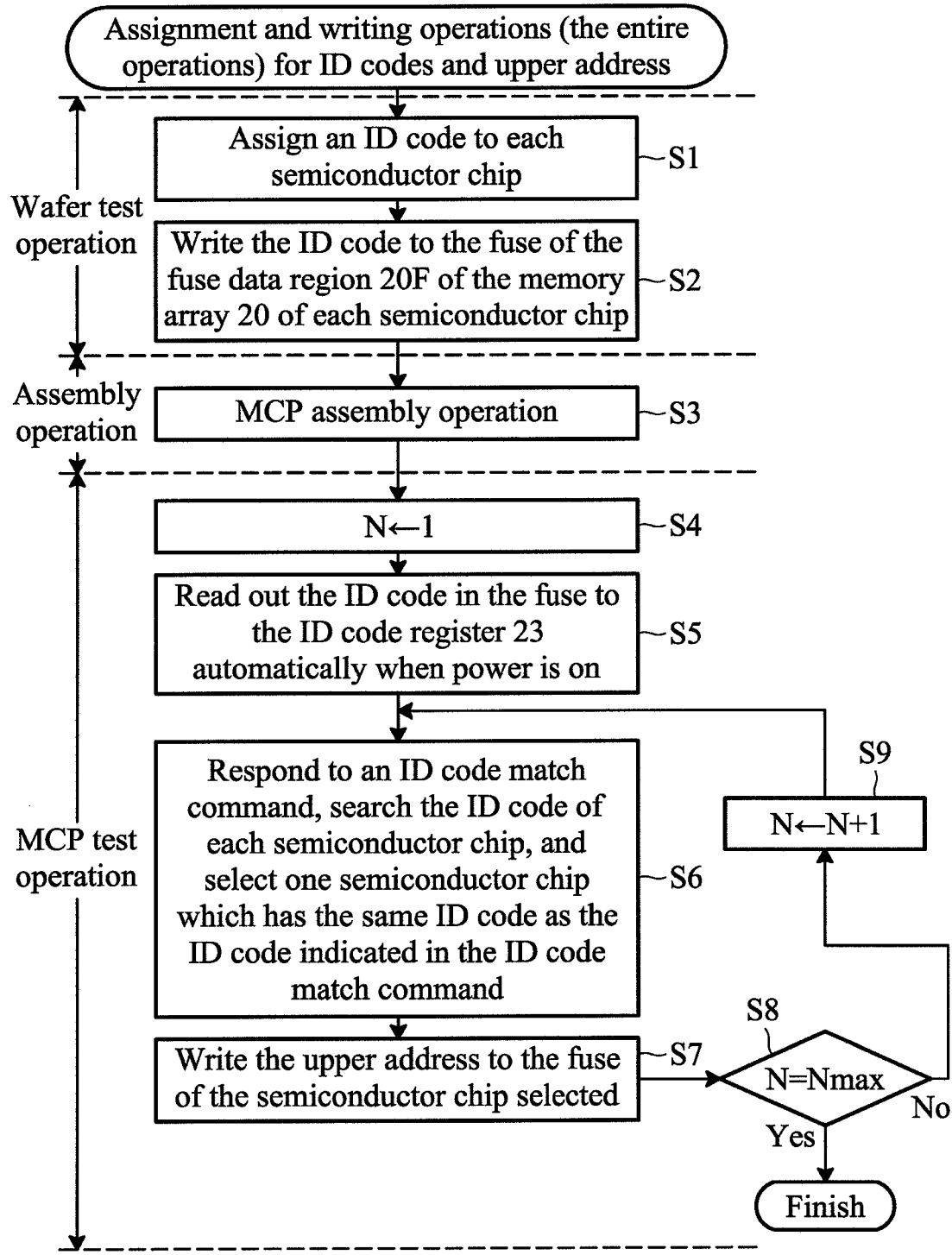
FIG. 4 is a flowchart showing the assignment and writing operations (the entire operations) of ID codes and upper address for a plurality of semiconductor chips in accordance with an embodiment of the invention.

FIG. 4 is a flowchart showing assignment and writing operations (the entire operations) of ID codes and upper address for a plurality of semiconductor chips in accordance with an embodiment of the invention. In the operations of FIG. 4, the wafer test operation and the MCP test operation are operations carried out by connecting the semiconductor chip to a predetermined tester (external device).

Figure 1:
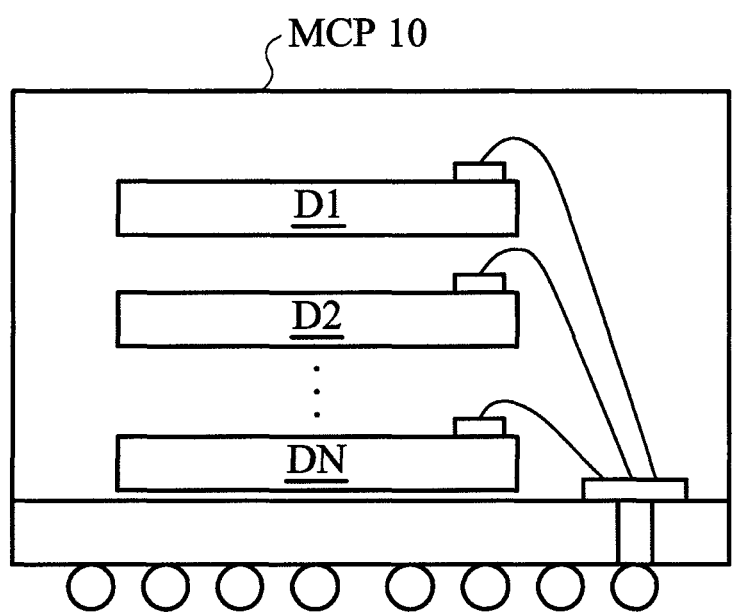
FIG. 1 is a sectional view showing the wire arrangement of semiconductor chips D1~DN of a multi-chip package 10 in accordance with the conventional art.
Figure 2:
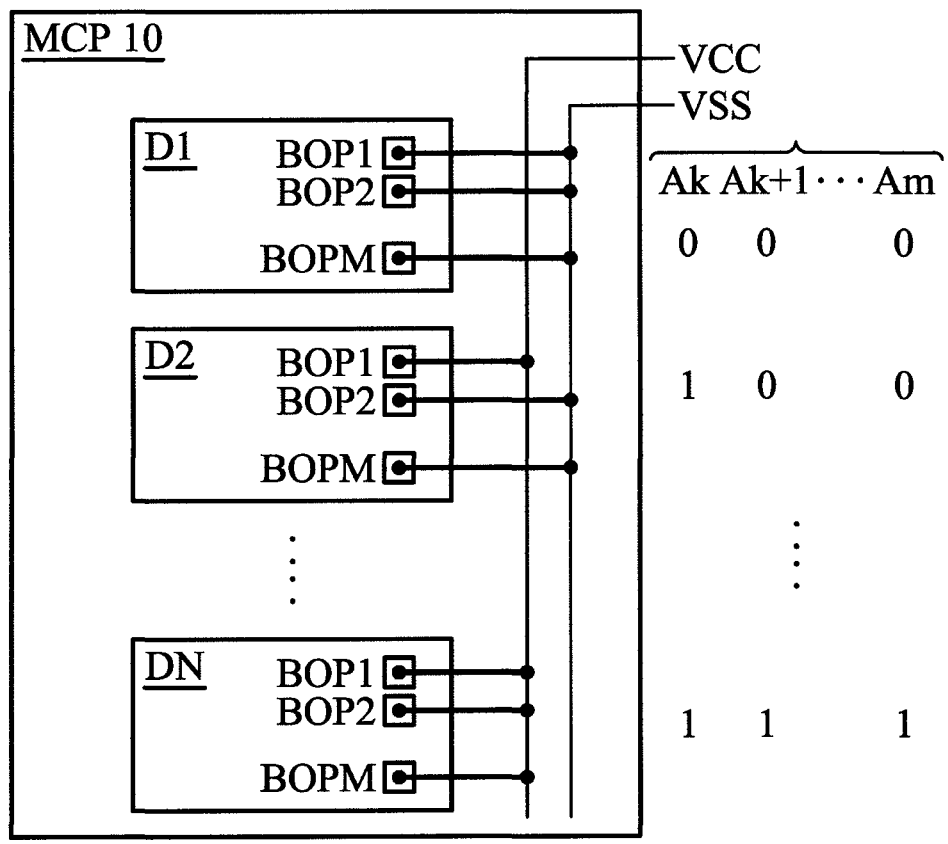
FIG. 2 is a circuit diagram showing a writing method for writing an ID code and an upper address to each of the semiconductor chips D1~DN of the multi-chip package shown in FIG. 1.

In FIG. 4, first, in the wafer test operation, a unique ID code (for example, the serial number of a semiconductor chip) is assigned to each semiconductor chip in step S1. In step S2, the assigned ID code is input to each semiconductor chip by a tester so as to be written into the fuse in the fuse data region 20F of the memory cell array 20 of each semiconductor chip. Following this, in step S3, an MCP assembly operation is performed wherein a plurality of semiconductor chips are stacked and assembled. Here, in the embodiment, the MCP assembly operation is performed without wirings for the bonding pads of the upper addresses as shown in FIG. 2.

In the MCP test operation, the MCP is connected to the tester and in step S4, a parameter N is set to 1. In step S5, The ID codes in the fuses of all of the semiconductor chips are read automatically via the page buffers 21 and then stored temporarily in the ID code registers 23 at power-on. In step S6, an ID code search carried out by the tester is started, wherein in response to an ID code match command from the tester, the ID code of each semiconductor chip is searched and the semiconductor chip provided with the ID code consistent with the ID code indicated in the ID code match command is selected. Here, the /R/B signal of the semiconductor chip provided with the consistent ID code becomes low active. The tester can detect the low status and proceed to the next step. In step S7, an upper address is written from the tester into the fuse of the selected semiconductor chip via the input/output buffer 31. In step S8, it is judged whether the parameter N is equal to the maximum value Nmax. If the answer in step S8 is "NO", it means the MCP test operation has not been performed for all of the semiconductor chips, and the operation proceeds to step S9. In step S9, the parameter N is increased by 1 and the operation proceeds to step S6 for searching another ID code. On the other hand, if the answer in step S8 is "YES", it is considered that the MCP test operation has been performed for all of the semiconductor chips, and then the operation is finished. Here, "Nmax" represents the total number of the semiconductor chips stacked in the MCP.

Figure 5A:
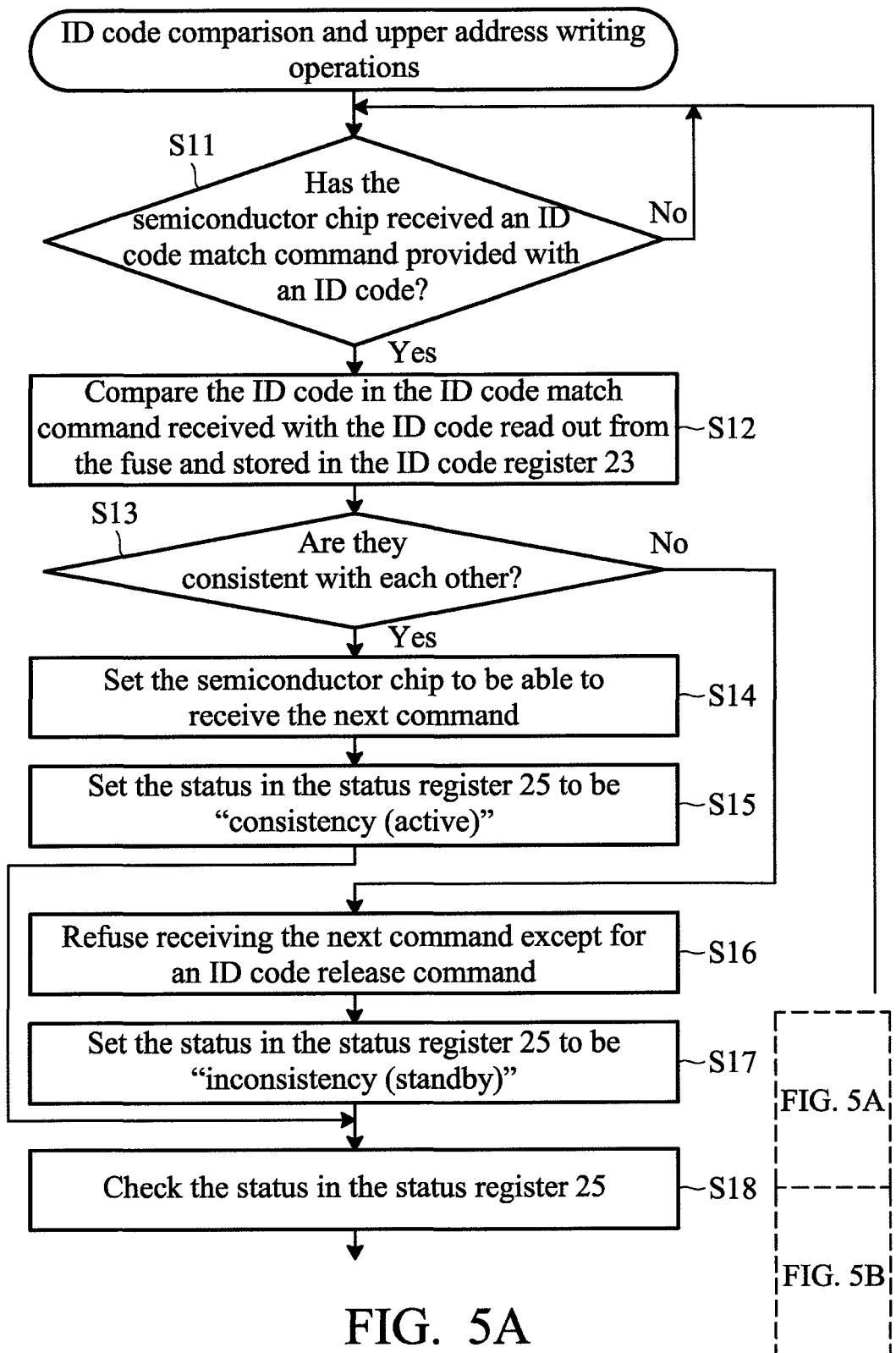
FIGS. 5A and 5B are a flowchart showing the detail of the ID code comparison and the upper address writing operation for each semiconductor chip, performed in the MCP test operation of FIG. 4.
Figure 5B:
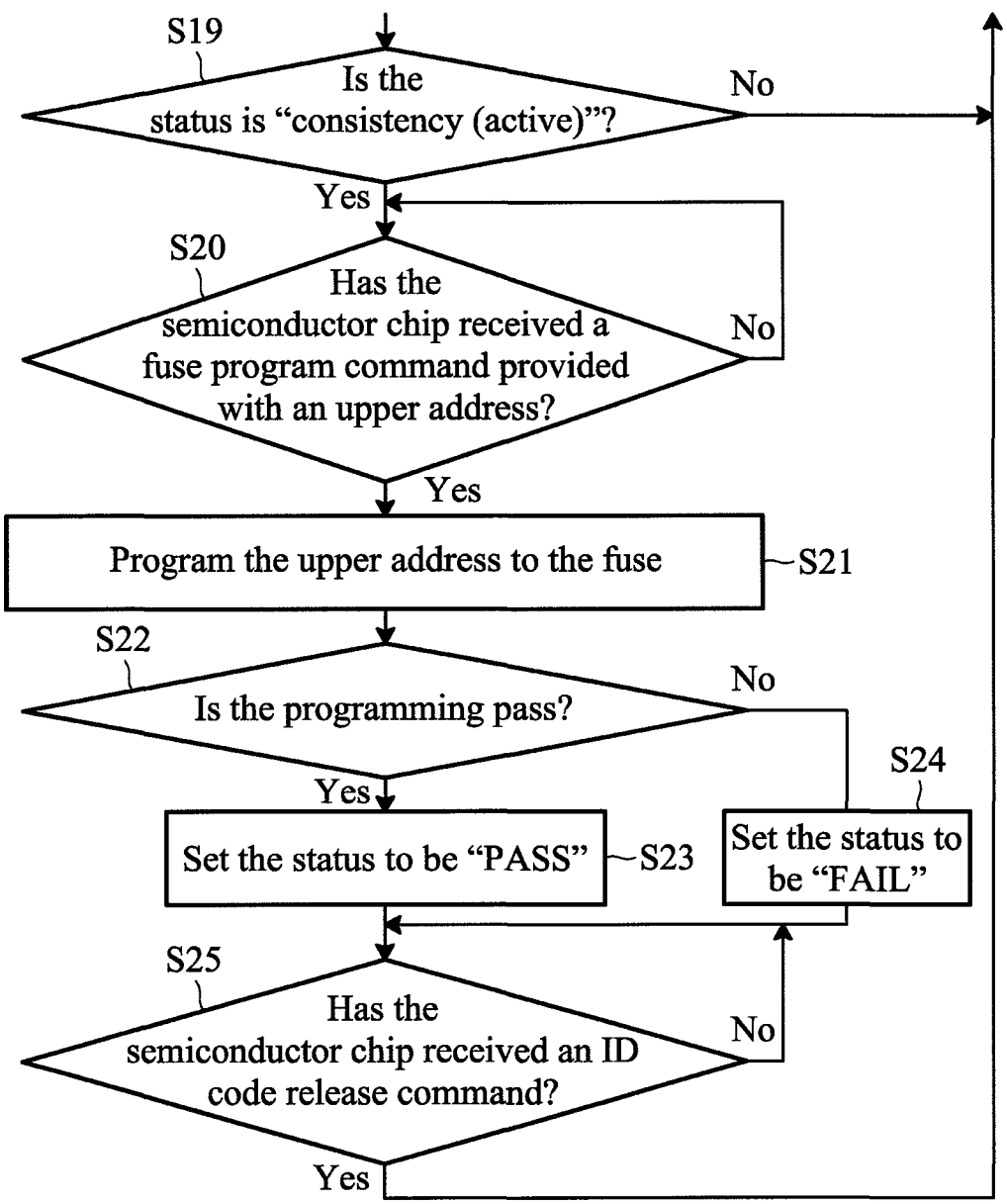

FIGS. 5A and 5B are a flowchart showing the detail of the ID comparison and the upper address writing operation for each semiconductor chip, performed in the MCP test operation of FIG. 4.

In FIGS. 5A and 5B, first, in step S11, it is determined whether the semiconductor chip has received an ID code match command provided with an ID code and generated periodically from the tester (the ID code to be searched for is input in the tester and stored in the inner memory of the tester in advance, or generated by a predetermined logic). If the answer is "YES", the operation proceeds to step S12. If the answer is "NO" the operation goes back to step S11 and the operation of step S11 is repeated. Next, in step S12, the ID code in the ID code match command received is compared with the ID code read from the fuse and stored in the ID code register. In step S13, it is determined whether there is consistency between them. If the answer is "YES" the operation proceeds to step S14. If the answer is "NO" the operation proceeds to step S16. In step S14, the semiconductor chip is set to be able to receive the next command. In step S15, the status in the status register 25 is set to be "consistency (active)", and the operation proceeds to step S18. On the other hand, in step S16, the semiconductor chip is set to be unable to receive the next command except for an ID code release command. In step S17, the status in the status register 25 is set to be "inconsistency (standby)", and the operation proceeds to step S18.

In step S18, the status is checked. In step S19, it is determined whether the status is "consistency (active)". If the answer is "YES", the operation proceeds to step S20. Otherwise, if the answer is "NO", the operation goes back to step S11. In step S20, it is determined whether the semiconductor chip has received a fuse program command provided with an upper address. If the answer is "YES" the operation proceeds to step S21. Otherwise, if the answer is "NO", the operation goes back to step S20 and the receiving operation in step S20 is repeated. In step S21, the upper address is programmed (written) into the fuse from the tester. In step S22, it is determined whether the program is PASS. If the answer is "YES", the operation proceeds to step S23. Otherwise, if the answer is "NO", the operation proceeds to step S24. In step S23, status is set to "PASS" and the operation proceeds to step S25. In step S24, status is set to "FAIL" and the operation proceeds to step S25. In step S25, it is determined whether the semiconductor chip has received an ID release command. If the answer is "YES", the writing operation for the upper address is finished normally, and it is determined that access from the tester, which is an external device, is finished. The operation goes back to step S11. Otherwise, if the answer is "NO", the operation goes back to step S25 and the receiving operation in step S25 is repeated.

Figure 6:
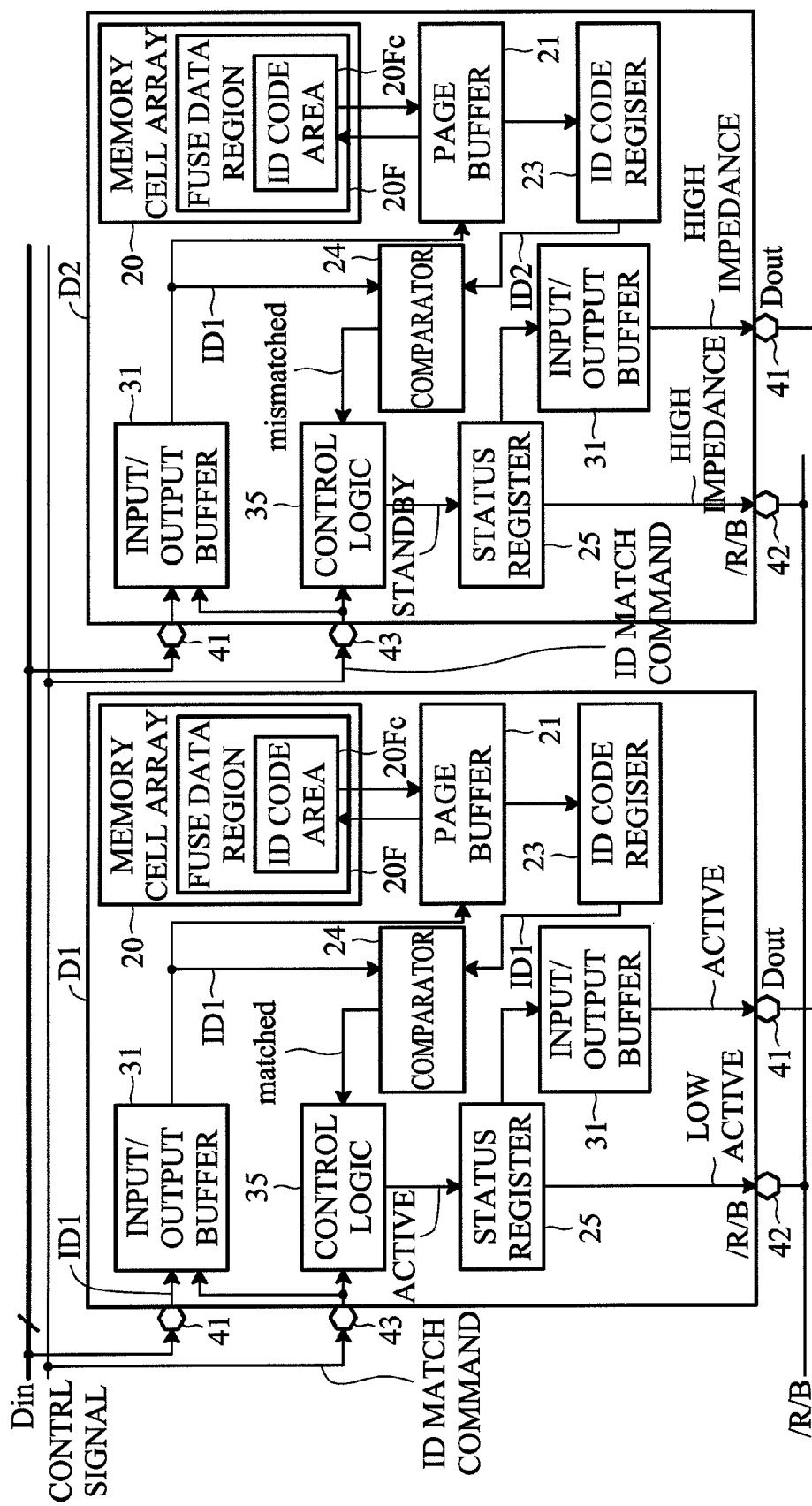
FIG. 6 is a block diagram showing the operations of two semiconductor chips D1 and D2 in accordance with an embodiment of the invention.

FIG. 6 is a block diagram showing the operations of two semiconductor chips D1 and D2 in accordance with an embodiment of the invention. In FIG. 6, the semiconductor chip D1 has an ID code "ID1", and the semiconductor chip D2 has an ID code "ID2." In this case, an ID code match command provided with the ID code "ID1" is input from the tester to semiconductor chips D1 and D2.

In the embodiment, for all of the semiconductor chips, pins with the same name are all connected together. Before the upper address is written into each semiconductor chip, all of the semiconductor chips are the same except for their ID codes. Regarding the semiconductor chip D1, when an ID match command provided with an ID code to be search for is input to each semiconductor chip, the ID code "ID1" is read from an ID code area 20Fc of the fuse data region 20F of the memory cell array 20 and stored in the ID code register 23 via the page buffer 21. After that, the ID code "ID1" is output to the comparator 24. Meanwhile, the ID code "ID1" in the ID code match command from the tester is input to the comparator 24 via the input/output buffer 31. Because the two ID codes are consistent with each other, the comparator 24 outputs a consistency signal to the control logic 35. In response to the consistency signal, the control logic 35 sets the status register 25 to "consistency (active)." At this time, the status register 25 generates and outputs a low-active /R/B signal. The semiconductor chip D1 shows "READY" (a status that represents the semiconductor chip is allowed to receive other commands, for example, a test command from the tester) to external devices such as the tester, and sets the terminal of the input/output buffer 31 to active status. Data can be transferred via the data bus.

Regarding the semiconductor chip D2, when an ID match command providing an ID code to be search for is input to each semiconductor chip, the ID code "ID2" is read from an ID code area 20Fc of the fuse data region 20F of the memory cell array 20 and stored in the ID code register 23 via the page buffer 21. After that, the ID code "ID2" is output to the comparator 24. Meanwhile, the ID code "ID1" in the ID code match command from the tester is input to the comparator 24 via the input/output buffer 31. Because the two ID codes are not consistent with each other, the comparator 24 outputs an inconsistency signal to the control logic 35. In response to the inconsistency signal, the control logic 35 sets the status register 25 to "inconsistency (standby)." At this time, the status register 25 signals the terminal of the /R/B signal to stay in high-impedance status. The semiconductor chip D2 shows "BUSY" to external devices such as the tester, and sets the terminal of the input/output buffer 31 to high-impedance status.

As described above, only one semiconductor chip is in an active state. Read and write operations are allowed to be performed on the memory cell array 20 until the semiconductor chip receives a predetermined release command. In this period, an upper address is written to the semiconductor chip.

Figure 7:
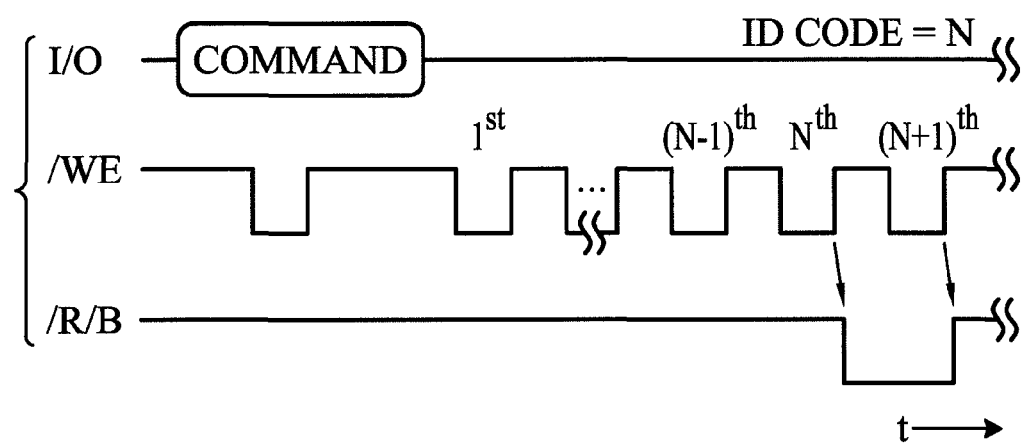
FIG. 7 is a timing chart showing an operation example based on an ID code search command for a quick search in accordance with an example of a modification of the invention.

FIG. 7 is a timing chart showing an operation example based on an ID code search command for a quick search in accordance with an example of a modification of the invention. Namely, the ID code search command for a quick search is used to replace the ID code match command provided with an ID code of the previously mentioned embodiment. After the ID code search command is input into the control logic 35, a write-enable signal /WE is toggled from the tester. Because the ID code is represented by a binary number consisting of "1" and "0", the toggle number (the number of low-level pulses) of the write-enable signal /WE which is consistent with the ID code is counted by the counter 37 shown in FIG. 3. When consistency between them (in FIG. 7, ID code is N) is detected by the comparator 24, the status register 25 outputs a low-active /R/B signal to the /R/B signal terminal 42. The toggle number of the write-enable signal /WE is also counted in the tester. The tester responds to the low-active /R/B signal and identifies the count value as the ID code. Therefore, the tester can search for ID codes of all semiconductor chips at once by recording the toggle number of the time the /R/B signal becomes low and continuously toggling for the remaining semiconductor chips in the MCP. In this way, after the ID code search command is used, by using ID match command, the write operation of an upper address can be performed on the semiconductor chip corresponding to the ID code.

In the modification embodiment, the pulse number of the write-enable signal /WE input into the semiconductor chip from the tester, which is an external device, is counted. When the count value is equal to the value of the ID code of the semiconductor chip, it is judged that the ID code search command indicating a search for a predetermined ID code is received, and then the next ID search operation is performed.

If the maximum value of the ID code is 100000 (shown by a decimal number) and the toggle period of the write-enable signal /WE is 200 ns, the maximum search period will be 20 ms. Therefore, a quick search for ID codes can be performed on the semiconductor chip at high speed.

Though the write-enable signal /WE is taken as the signal to be toggled, it is not limited thereto. A write-protect signal /WP, an address latch enable signal ALE, etc . . . is also applicable.

In the above embodiments, for each semiconductor chip, the ID code and the upper address are written into, for example, the fuse of the memory cell array of the flash memory (a non-volatile memory type fuse element), but the invention is not limited thereto. The ID code and the upper address can be written into any other predetermined non-volatile memory or device of each semiconductor chip, such as an electrically-erasable programmable read-only memory (EEPROM).

In addition, it is unnecessary that the ID codes are perfectly unique for each semiconductor chip. What is necessary for ID uniqueness is just a grade not to generate mistake which stacks chips of the same ID in the assembly process. And, if each semiconductor chip has a perfectly unique ID code, predetermined number of lower bits can be used as the ID code of this invention.

In the above embodiments, the writing method of ID codes and upper address for a semiconductor non-volatile memory device such as a flash memory is described, but the invention is not limited thereto. The invention is also applicable for many kinds of memory devices, for example, a semiconductor volatile memory device such as a DRAM. In this case, the non-volatile memory for storing the ID codes and the upper addresses needs to be further provided in addition to the semiconductor volatile memory device such as a DRAM.

As described above, according to the semiconductor memory device and the writing method of ID codes and upper addresses thereof of the invention, the ID codes and the upper addresses can be assigned and easily written to each of the semiconductor chips in a multi-chip package without increasing the size of the semiconductor chips in comparison with the prior art.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor memory device which is stacked together with other semiconductor memory devices to form a multi-chip package, the semiconductor memory device comprising:
    a non-volatile memory means storing an ID code and an upper address, and
    a first comparing means responding to an ID code match command which is input from an external device to the semiconductor memory device and indicates a predetermined ID code, searching for the ID code of the semiconductor memory device, comparing the predetermined ID code and the ID code, and outputting a comparison result,
    wherein the ID code is written into the non-volatile memory means before the assembly process,
    the semiconductor memory device is a flash memory, and the non-volatile memory means is a memory type fuse element in a memory cell array of the flash memory,
    when the first comparing means outputs the comparison result showing the predetermined ID code and the ID code are consistent with each other, the semiconductor memory device has an active status to be allowed to receive other commands from the external device until the semiconductor memory device receives an ID release command input from the external device and indicating access from the external device is finished, and
    when the first comparing means outputs the comparison result showing the predetermined ID code and the ID code are not consistent with each other, the semiconductor memory device goes into a standby status to wait for the ID code match command or the ID release command.

2. The semiconductor memory device as claimed in claim 1, further comprising:
    a signal output means for outputting a signal showing that the semiconductor memory device is ready when the first comparing means outputs the comparison result showing the ID codes are consistent with each other.

3. The semiconductor memory device as claimed in claim 1, wherein the II) code match command is input to the semiconductor memory device after a plurality of the semiconductor memory devices are stacked to form the multi-chip package.

4. The semiconductor memory device as claimed in claim 1, wherein the predetermined ID code indicated by the ID match command is stored in a memory means of the external device.

5. The semiconductor memory device as claimed in claim 1, wherein the ID code is written into the non-volatile memory means of the semiconductor memory device in the wafer test operation.

6. The semiconductor memory device as claimed in claim 1, further comprising:
    a first register means for reading and storing the ID code read from the non-volatile memory means when the semiconductor memory device is powered on.

7. The semiconductor memory device as claimed in claim 1, wherein the upper address is written into the non-volatile memory means when a plurality of the semiconductor memory devices are stacked to form the multi-chip package and the semiconductor memory device is under the active status.

8. The semiconductor memory device as claimed in claim 7, further comprising:
    a second register means for reading and storing the upper address read from the non-volatile memory means when the semiconductor memory device is powered on.

9. A semiconductor memory device which is stacked together with other semiconductor memory devices to form a multi-chip package, the semiconductor memory device comprising:
    a non-volatile memory means storing an ID code and an upper address, and
    a second comparing means responding to an input signal which is toggled and an ID code search command which is input from an external device to, the semiconductor memory device, counting the pulse number of the input signal toggled, comparing the count value with the ID code of the semiconductor memory device, outputting a comparison result, and keep searching until the count value is equal to the ID code,
    wherein the ID code is written into the non-volatile memory means before the assembly process,
    the semiconductor memory device is a flash memory, and the non-volatile memory means is a memory type fuse element in a memory cell array of the flash memory,
    when the second comparing means outputs the comparison result showing the count value and the ID code are consistent with each other, the semiconductor memory device has an active status to be allowed to receive other commands from the external device until the semiconductor memory device receives an ID release command input from the external device and indicating access from the external device is finished, and
    when the second comparing means outputs the comparison result showing the count value and the ID code are not consistent with each other, the semiconductor memory device goes into a standby status to wait for the ITS code match command or the ID release command.

10. The semiconductor memory device as claimed in claim 9, further comprising:
    a signal output means for outputting a signal showing that the semiconductor memory device is ready when the second comparing means outputs the comparison result showing the ID codes are consistent with each other.

11. The semiconductor memory device as claimed in claim 9, wherein the ID code search command is input to the semiconductor memory device after a plurality of the semiconductor memory devices are stacked to form the multi-chip package.

12. The semiconductor memory device as claimed in claim 9, wherein the predetermined ID code indicated by the ID search command is stored in a memory means of the external device.

13. The semiconductor memory device as claimed in claim 9, wherein the ID code is written into the non-volatile memory means of the semiconductor memory device in the wafer test operation.

14. The semiconductor memory device as claimed in claim 9, further comprising:
a first register means for reading and storing the ID code read from the non-volatile memory means when the semiconductor memory device is powered on.

15. The semiconductor memory device as claimed in claim 9, wherein the upper address is written into the non-volatile memory means when a plurality of the semiconductor memory devices are stacked to form the multi-chip package and the semiconductor memory device is under the active status.

16. The semiconductor memory device as claimed in claim 15, further comprising:
a second register means for reading and storing the upper address read from the non-volatile memory means when the semiconductor memory device is powered on.

17. A writing method for writing an ID code and an upper address to a semiconductor memory device, which is stacked together with other semiconductor memory devices to form a multi-chip package, wherein the semiconductor memory device comprises a non-volatile memory means storing an ID code and an upper address, and
wherein the writing method comprises:
writing the ID code into the non-volatile memory means before the assembly operation,
responding to an ID code match command which is input from an external device to the semiconductor memory device and indicates a predetermined ID code, searching for the ID code of the semiconductor memory device, comparing the predetermined ID code and the ID code, and outputting a comparison result,
when the comparison result shows the predetermined ID code and the ID code are consistent With each other, switching the semiconductor memory device into an active status to be allowed to receive other commands from the external device until the semiconductor memory device receives an ID release command input from the external device and indicating access from the external device is finished, and
when the comparison result shows the predetermined ID code and the ID code are not consistent with each other, switching the semiconductor memory device into a standby status to wait for the ID code match command or the ID release command.

18. The writing method as claimed in claim 17, Wherein the ID code is written into the non-volatile memory means in the wafer test operation.

19. The writing method as claimed in claim 17, further comprising:
writing the upper address into the non-volatile memory means when a plurality of the semiconductor memory devices are stacked to form the multi-chip package and the semiconductor memory device is under the active status.

20. A writing method for writing an ID code and an upper address to a semiconductor memory device, which is stacked together with other semiconductor memory devices to form a multi-chip package, wherein the semiconductor memory device comprises a
non-volatile memory means storing an ID code and an upper address, and wherein the writing method comprises: writing the ID code into the non-volatile memory means before the assembly operation, responding to an input signal which is toggled mid an ID code search command which is input from an external device to the semiconductor memory device, counting the pulse number of the input signal toggled, comparing the count value with the ID code of the semiconductor memory device, outputting a comparison result, and keep searching until the count value is equal to the ID code,
when the comparison result shows the count value and the ID code are consistent with each other, switching the semiconductor memory device into an active status to be allowed to receive other commands from the external device until the semiconductor memory device receives an ID release command input from the external device and indicating access from the external device is finished, and
when the comparison result shows the count value and the ID code are not consistent with each other, switching the semiconductor memory device into a standby status to wait for the ID code match command or the ID release command.

21. The writing method as claimed in claim 20, wherein the ID code is written into the non-volatile memory means in the wafer test operation.

22. The writing method as claimed in claim 20, further comprising:
writing the upper address into the non-volatile memory means when a plurality of the semiconductor memory devices are stacked to form the multi-chip package and the semiconductor memory device is under the active status.

* * * * *